(12) United States Patent
Utsunomiya

(10) Patent No.: US 12,529,715 B2
(45) Date of Patent: Jan. 20, 2026

(54) CURRENT DETECTION CIRCUIT

(71) Applicant: ABLIC Inc., Nagano (JP)

(72) Inventor: Fumiyasu Utsunomiya, Nagano (JP)

(73) Assignee: ABLIC Inc., Nagano (JP)

( * ) Notice: Subject to any disclaimer, the term of this patent is extended or adjusted under 35 U.S.C. 154(b) by 27 days.

(21) Appl. No.: 18/599,119

(22) Filed: Mar. 7, 2024

(65) Prior Publication Data

US 2024/0319235 A1    Sep. 26, 2024

(30) Foreign Application Priority Data

Mar. 22, 2023   (JP) ................................. 2023-045212

(51) Int. Cl.
| | | |
|---|---|---|
| *G01R 19/165* | (2006.01) | |
| *G01R 19/15* | (2006.01) | |
| *G01R 19/155* | (2006.01) | |

(52) U.S. Cl.
CPC ........ G01R 19/16519 (2013.01); G01R 19/15 (2013.01); G01R 19/155 (2013.01)

(58) Field of Classification Search
CPC .............. G01R 19/16519; G01R 19/15; G01R 19/155; G01R 15/00; G01R 19/0092; G01R 19/12; G01R 19/16576; H03K 5/2472; H03K 17/0822; H03K 4/502; H03K 3/012; H03K 3/0231; H03K 5/2481; H03K 17/162; H03K 17/687; H03K 17/6871; H03K 2217/0036; H03K 3/0233; H03K 5/1534; H03K 17/223; H03K 19/0185; H03K 2217/0081; G05F 3/24; G05F 3/262

See application file for complete search history.

(56) References Cited

U.S. PATENT DOCUMENTS

| | | | | |
|---|---|---|---|---|
| 8,717,727 B2* | 5/2014 | Nakahara | ................. | H02H 7/10 |
| | | | | 361/93.1 |
| 8,841,898 B2* | 9/2014 | Van Deventer | ........ | B64D 45/02 |
| | | | | 324/72 |
| 2002/0176215 A1* | 11/2002 | Hiyama | ............. | H03K 17/0406 |
| | | | | 361/58 |
| 2014/0176199 A1* | 6/2014 | van Liempd | .......... | H03K 17/06 |
| | | | | 327/109 |

FOREIGN PATENT DOCUMENTS

JP     H0983452     3/1997

* cited by examiner

*Primary Examiner* — Lincoln D Donovan
*Assistant Examiner* — James G Yeaman
(74) *Attorney, Agent, or Firm* — JCIPRNET

(57) ABSTRACT

A current detection circuit includes: an input port; an output port; a rectifying element; a capacitor; a first first conductivity type MOS transistor; and a voltage detection circuit. The input port is connected to an anode terminal of the rectifying element, the drain terminal of the first first conductivity type MOS transistor, and a voltage detection terminal of the voltage detection circuit. A cathode terminal of the rectifying element is connected to a first terminal of the capacitor and a gate terminal of the first first conductivity type MOS transistor. A second terminal of the capacitor and a source terminal of the first first conductivity type MOS transistor are connected to a first power source terminal. A detection result output port of the voltage detection circuit 105 is connected to the output port.

3 Claims, 3 Drawing Sheets

CURRENT DETECTION CIRCUIT

CROSS-REFERENCE TO RELATED APPLICATION

This application claims the priority benefits of Japanese application no. 2023-045212, filed on Mar. 22, 2023. The entirety of the above-mentioned patent application is hereby incorporated by reference herein and made a part of this specification.

BACKGROUND

Technical Field

The present invention relates to a current detection circuit.

Description of Related Art

A current detection circuit used in a light receiving circuit of an infrared remote controller (hereinafter referred to as "infrared remote controller") to separate the DC component from the signal component in the input current from the photodiode that receives the light and detect the signal component has been disclosed. The DC component in the input current is derived from ambient light such as sunlight or room illumination. The signal component in the input current is the signal component originating from the transmitter of the infrared remote controller.

Conventional current detection circuits detect signal components based on voltage changes in a resistor that occur in the case that a current change due to the signal component flows through the resistor. In the case that the amount of current change due to the signal component is very small, the change amount in the voltage at two ends of the resistor becomes very small. In the case that the amount of current change due to the signal component is very small, conventional current detection circuits are unable to detect the signal component. The purpose of the present invention is to provide a current detection circuit capable of detecting the current change due to a very small signal component for the DC component in the input current.

SUMMARY

The current detection circuit of the present invention includes: an input port; an output port; a rectifying element; a capacitor; a first first conductivity type MOS transistor; and a voltage detection circuit. The input port is connected to an anode terminal of the rectifying element, a drain terminal of the first first conductivity type MOS transistor, and a voltage detection terminal of the voltage detection circuit. A cathode terminal of the rectifying element is connected to a first terminal of the capacitor and a gate terminal of the first first conductivity type MOS transistor. A second terminal of the capacitor and a source terminal of the first first conductivity type MOS transistor are connected to a first power source terminal. A detection result output port of the voltage detection circuit is connected to the output port.

DESCRIPTION OF THE EMBODIMENTS

First Embodiment

Figure 1:
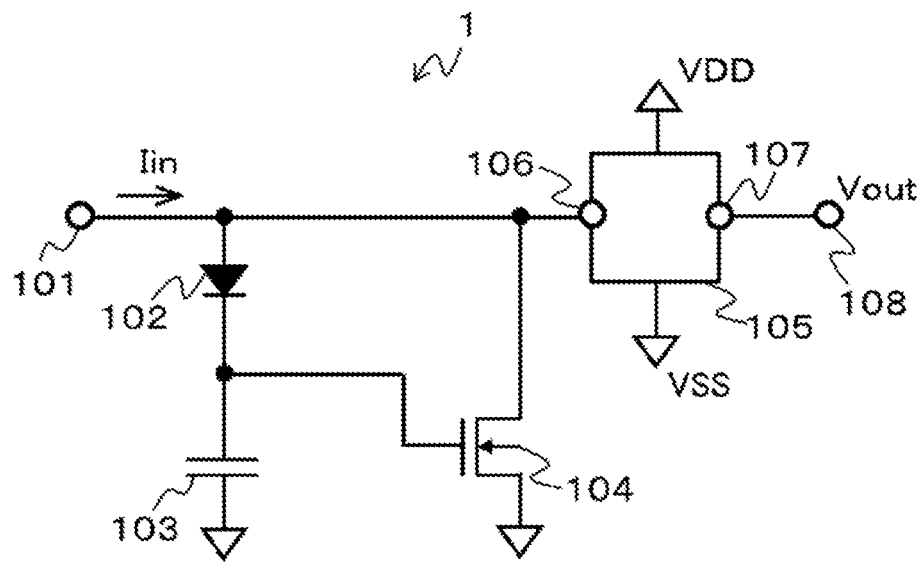
FIG. 1 is a circuit diagram illustrating one example of the current detection circuit according to the first embodiment of the present invention.

The configuration of a current detection circuit 1 of this embodiment is described based on FIG. 1. FIG. 1 is a circuit diagram illustrating one example of the current detection circuit 1 according to this embodiment. The current detection circuit 1 of this embodiment includes an input port 101, a rectifying element 102, a capacitor 103, a first N-channel type MOS type transistor (hereinafter referred to as NMOS transistor) 104, a first voltage detection circuit 105, and an output port 108.

The connection of the current detection circuit 1 of this embodiment is described. The input port 101 is connected to an anode terminal of the rectifying element 102, the drain terminal of the first NMOS transistor 104, and a voltage detection terminal 106 of the first voltage detection circuit 105. A cathode terminal of the rectifying element 102 is connected to the first terminal of the capacitor 103 and the gate terminal of the first NMOS transistor 104. A detection result output port 107 of the first voltage detection circuit 105 is connected to the output port 108. The first voltage detection circuit 105 is connected to a positive power source terminal VDD and a negative power source terminal VSS. The second terminal of the capacitor 103 and the source terminal of the first NMOS transistor 104 are connected to the negative power source terminal VSS.

Figure 2:
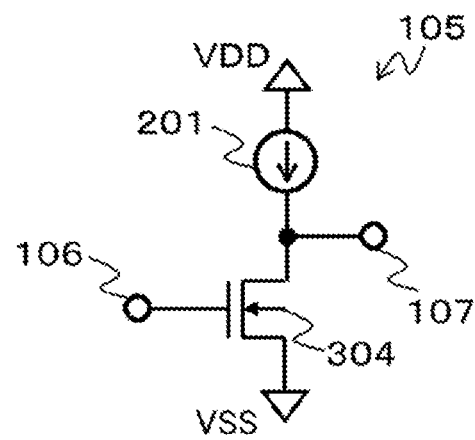
FIG. 2 is a circuit diagram illustrating one example of the voltage detection circuit according to the first embodiment of the present invention.

The configuration and connections of the first voltage detection circuit 105 of this embodiment is described based on FIG. 2. FIG. 2 is a circuit diagram illustrating one example of the first voltage detection circuit 105 according to this embodiment. The first voltage detection circuit 105 of this embodiment includes a voltage detection terminal 106, a second NMOS transistor 304, a load element 201, and a detection result output port 107. The voltage detection terminal 106 is connected to the gate terminal of the second NMOS transistor 304. The drain terminal of the second NMOS transistor 304 is connected to the first terminal of the load element 201 and the detection result output port 107. The second terminal of the load element 201 is connected to the positive power source terminal VDD. The source terminal of the second NMOS transistor 304 is connected to the negative power source terminal VSS.

The operation of the current detection circuit 1 of this embodiment is described. First, the case in which the input current Iin received by the input port 101 of the current detection circuit 1 contains no signal component and the current value does not change is described. The input current Iin becomes the drain current of the first NMOS transistor 104 and charges the capacitor 103 from the input port 101 via the rectifying element 102. A charged voltage from the input port 101 to the capacitor 103 via the rectifying element 102 is applied to the gate terminal of the first NMOS transistor. The voltage of the input port 101 is near the gate terminal voltage of the first NMOS transistor 104 due to the drain current of the first NMOS transistor 104.

In other words, the voltage of the input port 101 is near the threshold voltage of the first NMOS transistor 104. The first voltage detection circuit 105 outputs a low level voltage near the voltage of the negative power source terminal VSS to the detection result output port 107 in the case that the voltage of the voltage detection terminal 106 is near the threshold voltage of the first NMOS transistor 104. The output port 108 is connected to the detection result output port 107 and outputs the low level voltage near the voltage of the negative power source terminal VSS. Thus, the output port 108 does not output a detection signal.

The charging of the capacitor 103 is performed by the forward current of the rectifying element 102 via the rectifying element 102. The discharging of the capacitor 103 is performed by the leakage current of the rectifying element 102 via the rectifying element 102. Thus, the voltage of the capacitor 103 rises quickly during charging and decreases slowly during discharging.

Next, the case in which the input current Iin received by the input port 101 of the current detection circuit 1 contains the signal component and the current value changes is described. The input current Iin includes the signal component, and the input current Iin fluctuates. The voltage of the gate terminal of the first NMOS transistor 104 rises immediately as the input current Iin increases, up to the voltage of the gate terminal where the capacitor 103 is charged via the rectifying element 102 and the drain current corresponding to the increased input current Iin is flowing. The voltage of the input port 101 remains near the threshold voltage of the first NMOS transistor 104. On the other hand, the voltage of the gate terminal of the first NMOS transistor 104 is kept constant for a while by the capacitor 103 as the input current Iin decreases. The first NMOS transistor 104 supplies the current value before the input current Iin decreases to the negative power source terminal VSS as the drain current. Since the drain current of the first NMOS transistor 104 flows more than the input current Iin, the voltage of the input port 101 drops to near the voltage of the negative power source terminal VSS.

The first voltage detection circuit 105 detects that the voltage of input port 101 has decreased from near the threshold voltage of the first NMOS transistor 104. The first voltage detection circuit 105 outputs the voltage near the voltage of the positive power source terminal VDD to the output port 108 via the detection result output port 107 and outputs a high level voltage as the detection signal. In this way, the current detection circuit 1 of this embodiment is capable of detecting the signal component even in the case that the current drop amount due to the signal component of the input current Iin is very small.

The operation of the first voltage detection circuit 105 of this embodiment is described. In the case that the voltage of the voltage detection terminal 106 is near the threshold voltage of the first NMOS transistor 104, the drain current of the second NMOS transistor 304 is greater than the current flowing from the positive power source terminal VDD via the load element 201. Thus, the voltage of the detection result output port 107 is near the voltage of the negative power source terminal VSS. Next, in the case that the voltage of the voltage detection terminal 106 drops from near the threshold voltage of the first NMOS transistor 104, the drain current of the second NMOS transistor 304 is smaller than the current flowing from the positive power source terminal VDD via the load element 201. Thus, the voltage of the detection result output port 107 is near the voltage of the positive power source terminal VDD. The first voltage detection circuit 105 is able to set the voltage detection level near the threshold voltage of the first NMOS transistor 104 by providing the second NMOS transistor 304 with a threshold voltage near that of the first NMOS transistor 104.

As described above, the current detection circuit 1 in this embodiment is capable of detecting the current change due to a very small signal component for the DC component in the input current Iin received by the input port 101.

Second Embodiment

Figure 3:
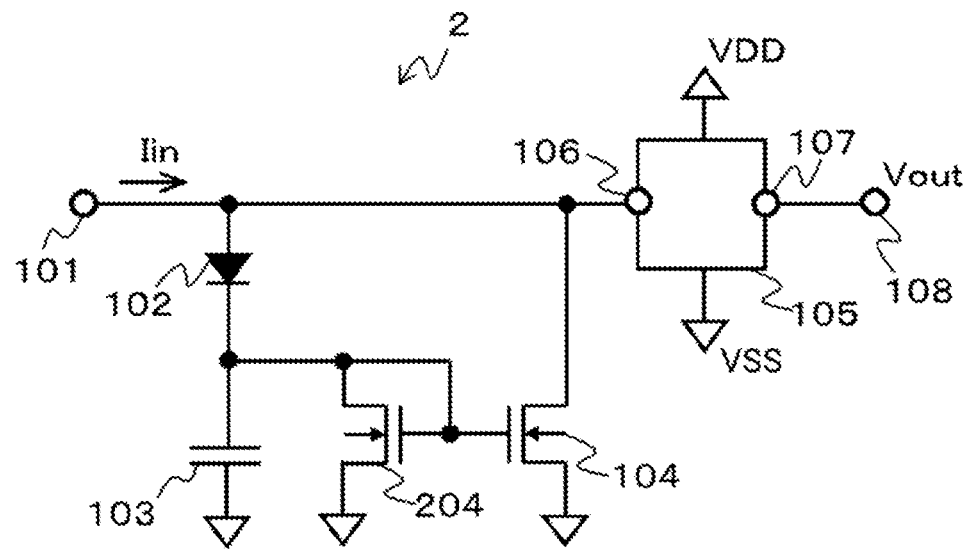
FIG. 3 is a circuit diagram illustrating one example of the current detection circuit according to the second embodiment of the present invention.

The second embodiment of this embodiment is described based on FIG. 3. FIG. 3 is a circuit diagram illustrating one example of the current detection circuit 2 according to this embodiment. The current detection circuit 2 of this embodiment has a configuration in which a third NMOS transistor 204 is added to the current detection circuit 1 of the first embodiment.

The connection of the current detection circuit 2 of this embodiment is described. The gate terminal and the drain terminal of the third NMOS transistor 204 are connected to the gate terminal of the first NMOS transistor 104. The source terminal of the third NMOS transistor 204 is connected to the negative power source terminal VSS. The first NMOS transistor 104 and the third NMOS transistor 204 constitute a current mirror circuit.

The operation of the current detection circuit 2 of this embodiment is described. The input current Iin input from the input port 101 is distributed to the drain current of the third NMOS transistor 204 and the drain current of the first NMOS transistor 104 via the rectifying element 102 and flows to the negative power source terminal VSS. The discharging of the capacitor 103 is also performed by the drain current of the third NMOS transistor 204. However, the capacitor 103 operates as a smooth capacitor, and similar to the first embodiment, the voltage of the capacitor 103 rises quickly during charging and falls slowly during discharging.

Similar to the first embodiment, in the case that the input current Iin received by the input port 101 of the current detection circuit 2 contains no signal component and the current value does not change, the voltage of the input port 101 is near the threshold voltage of the first NMOS transistor 104. The first voltage detection circuit 105 outputs a low level voltage to the output port 108 via the detection result output port 107. Thus, the output port 108 does not output a detection signal. Next, in the case that the input current Iin input to the input port 101 of the current detection circuit 2 contains a signal component and the current drop amount of the input current Iin exceeds the drain current value of the third NMOS transistor 204, the voltage of the input port 101 drops to near the voltage of the negative power source terminal VSS. The first voltage detection circuit 105 outputs a high level voltage to the output port 108 via the detection result output port 107. Thus, the output port 108 outputs a detection signal.

The current detection circuit 2 in this embodiment is capable of adjusting the detection sensitivity by adjusting the ratio of the K value, which is the transconductance coefficient between the third NMOS transistor 204 and the first NMOS transistor 104. Specifically, in the case that the K value of the third NMOS transistor 204 is made smaller than the K value of the first NMOS transistor 104, the detection sensitivity becomes higher.

As described above, the current detection circuit 2 of this embodiment is capable of adjusting the sensitivity for detecting the signal component according to the ratio of the K value, which is the transconductance coefficient constituting the current mirror circuit, and, similar to the first embodiment, detecting the current change due to a very small signal component for the DC component in the input current Iin received by the input port 101.

Third Embodiment

Figure 4:
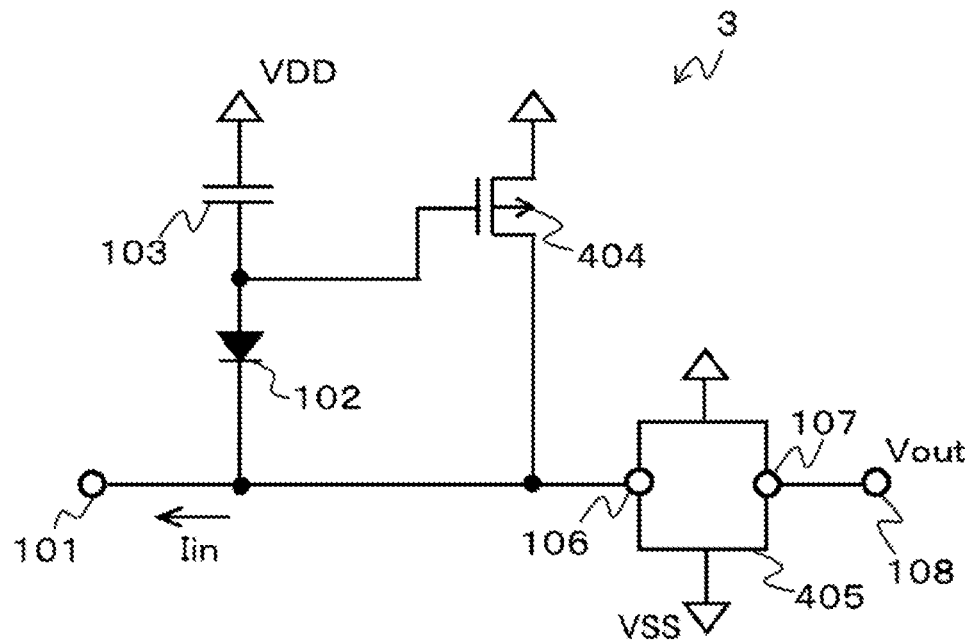
FIG. 4 is a circuit diagram illustrating one example of the current detection circuit according to the third embodiment of the present invention.

The third embodiment of this embodiment is described based on FIG. 4. FIG. 4 is a circuit diagram illustrating one example of the current detection circuit 3 according to this embodiment. The current detection circuit 3 of this embodiment is configured such that the NMOS transistor is replaced with a P-channel type MOS transistor (hereinafter referred to as PMOS transistor) for the current detection circuit 1 of the first embodiment. The current detection circuit 3 of this embodiment includes an input port 101, a rectifying element 102, a capacitor 103, a first PMOS transistor 404, a second voltage detection circuit 405, and an output port 108.

The connection of the current detection circuit 3 of this embodiment is described. The input port 101 is connected to a cathode terminal of the rectifying element 102, the drain terminal of the first PMOS transistor 404, and the voltage detection terminal 106 of the second voltage detection circuit 405. An anode terminal of the rectifying element 102 is connected to the first terminal of the capacitor 103 and the gate terminal of the first PMOS transistor 404. A detection result output port 107 of the second voltage detection circuit 405 is connected to the output port 108. The second voltage detection circuit 405 is connected to a positive power source terminal VDD and a negative power source terminal VSS. The second terminal of the capacitor 103 and the source terminal of the first PMOS transistor 404 are connected to the positive power source terminal VDD.

Figure 5:
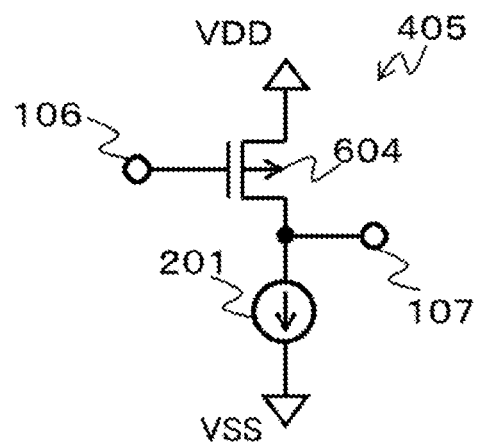
FIG. 5 is a circuit diagram illustrating one example of the voltage detection circuit according to the third embodiment of the present invention.

The configuration and connections of the second voltage detection circuit 405 is described based on FIG. 5. FIG. 5 is a circuit diagram illustrating one example of the second voltage detection circuit according to this embodiment. The second voltage detection circuit 405 of this embodiment is configured such that the NMOS transistor used in the first voltage detection circuit 105 in the first embodiment is replaced with a PMOS transistor. The second voltage detection circuit 405 of this embodiment includes a voltage detection terminal 106, a second PMOS transistor 604, a load element 201, and a detection result output port 107. The voltage detection terminal 106 is connected to the gate terminal of the second PMOS transistor 604. The drain terminal of the second PMOS transistor 604 is connected to the first terminal of the load element 201 and the detection result output port 107. The second terminal of the load element 201 is connected to the negative power source terminal VSS. The source terminal of the second PMOS transistor 604 is connected to the positive power source terminal VDD.

The operation of the current detection circuit 3 of this embodiment is described. In the current detection circuit 3 of this embodiment, the drain current of the first PMOS transistor 404 becomes the input current Iin and flows toward the input port 101. First, the case in which the input current Iin flows through the input port 101 contains no signal component and the current value does not change is described. The potential of the input port 101 is near the gate terminal voltage of the first PMOS transistor 404 due to the drain current of the first PMOS transistor 404. Similar to the first embodiment, in other words, the potential of the input port 101 is near the threshold voltage of the first PMOS transistor 404. The second voltage detection circuit 405 outputs a high level voltage near the voltage of the positive power source terminal VDD to the output port 108 via the detection result output port 107 in the case that the voltage of the voltage detection terminal 106 is near the threshold voltage of the first PMOS transistor 404. Thus, the output port 108 does not output a detection signal.

Next, the case in which the input current Iin flows through the input port 101 of the current detection circuit 3 contains the signal component and the current value changes is described. The input current Iin fluctuates in the case that the input current Iin includes the signal component. As the input current Iin increases, the voltage of the gate terminal of the first PMOS transistor 404 drops immediately to the voltage of the gate terminal through which the input current Iin flows. The voltage of the input port 101 remains near the threshold voltage of the first NMOS transistor 104. On the other hand, the voltage of the gate terminal of the first PMOS transistor 404 is kept constant for a while by the capacitor 103 as the input current Iin decreases. The first PMOS transistor 404 supplies the current value before the input current Iin decreases to the positive power source terminal VDD as the drain current. Since the drain current of the first PMOS transistor 404 flows more than the input current Iin, the voltage of the input port 101 rises to near the voltage of the positive power source terminal VDD.

The second voltage detection circuit 405 detects that the voltage of input port 101 has risen from near the threshold voltage of the first PMOS transistor 404. The second voltage detection circuit 405 outputs the low level voltage near the voltage of the negative power source terminal VSS to the output port 108 via the detection result output port 107 as the detection signal. Thus, the output port 108 outputs a detection signal.

The operation of the second voltage detection circuit 405 of this embodiment is described. The second voltage detection circuit 405, in the case that the voltage of the voltage detection terminal 106 is near the threshold voltage of the first PMOS transistor 404, the drain current of the second PMOS transistor 604 in which a current flows to the negative power source terminal VSS via the load element 201 is greater than the current that may flow in the second PMOS transistor 604. Thus, the voltage of the detection result output port 107 is near the voltage of the positive power source terminal VDD. Next, in the case that the voltage of the voltage detection terminal 106 rises from near the threshold voltage of the first PMOS transistor 404, the drain current of the second PMOS transistor 604 is smaller than the current flowing to the negative power source terminal VSS via the load element 201. Thus, the voltage of the detection result output port 107 is near the voltage of the negative power source terminal VSS. The second voltage detection circuit 405 is able to set the voltage detection level near the threshold voltage of the first PMOS transistor 404 by providing the second PMOS transistor 604 with a threshold voltage near that of the first PMOS transistor 404.

As described above, the current detection circuit 3 in this embodiment is capable of detecting the current change due to a very small signal component for the DC component in the input current Iin flowing in the input port 101.

Fourth Embodiment

Figure 6:
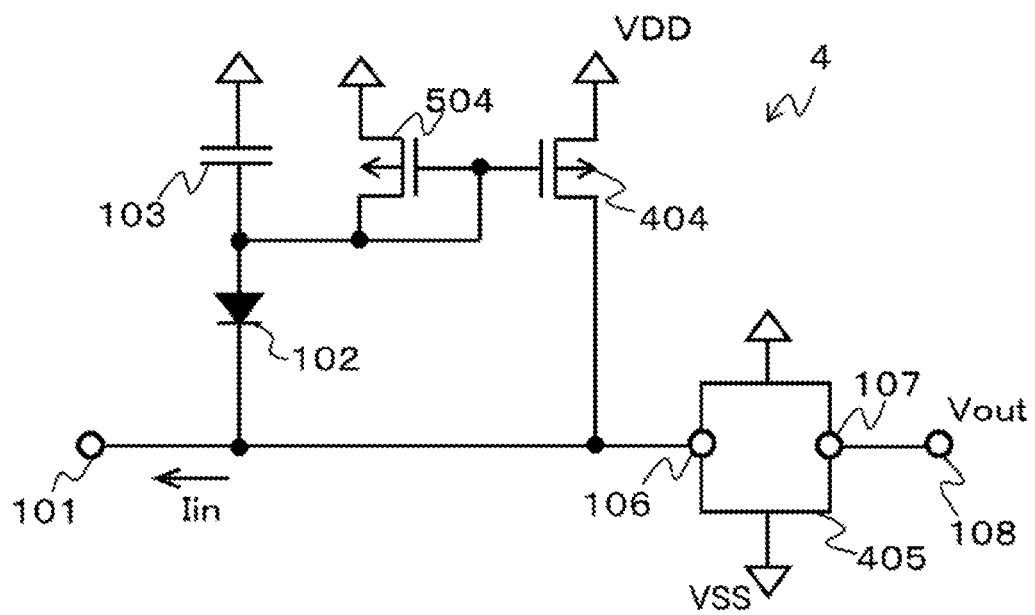
FIG. 6 is a circuit diagram illustrating one example of the current detection circuit according to the fourth embodiment of the present invention.

The fourth embodiment of this embodiment is described based on FIG. 6. FIG. 6 is a circuit diagram illustrating one example of the current detection circuit 4 according to this embodiment. The current detection circuit 4 of this embodiment is configured for the current detection circuit 2 of the second embodiment in which the NMOS transistor used in the current detection circuit 2 of the second embodiment is replaced with a PMOS transistor. At the same time, a third PMOS transistor 504 is added to the current detection circuit 3 of the third embodiment.

The connection of the current detection circuit 4 of this embodiment is described. The gate terminal and the drain terminal of the third PMOS transistor 504 are connected to the gate terminal of the first PMOS transistor 404. The source terminal of the third PMOS transistor 504 is connected to the positive power source terminal VDD. The first PMOS transistor 404 and the third PMOS transistor 504 constitute a current mirror circuit.

The operation of the current detection circuit 4 of this embodiment is described. The input current Iin is distributed from the positive power source terminal VDD to the drain current of the third PMOS transistor 504 and the drain current of the first PMOS transistor 404, and the drain current of the third PMOS transistor 504 is further combined with the drain current of the first PMOS transistor 404 via the rectifying element 102 and flows to the input port 101.

Similar to the third embodiment, first, in the case that the input current Iin flowing through the input port 101 of the current detection circuit 4 contains no signal component and the current value does not change, the voltage of the input port 101 is near the threshold voltage of the first PMOS transistor 404. The second voltage detection circuit 405 outputs a high level voltage to the output port 108 via the detection result output port 107. Thus, the output port 108 does not output a detection signal. Next, in the case that the input current Iin flowing through the input port 101 of the current detection circuit 4 contains a signal component and the current drop amount of the input current Iin is less than the drain current value of the third PMOS transistor 504, the voltage of the input port 101 rises to near the voltage of the positive power source terminal VDD. The second voltage detection circuit 405 outputs a low level voltage to the output port 108 via the detection result output port 107. Thus, the output port 108 outputs a detection signal.

The current detection circuit 4 in this embodiment is capable of adjusting the detection sensitivity by adjusting the ratio of the K value, which is the transconductance coefficient between the third PMOS transistor 504 and the first PMOS transistor 404. Specifically, in the case that the K value of the third PMOS transistor 504 is made smaller than the K value of the first PMOS transistor 404, the detection sensitivity becomes higher.

As described above, the current detection circuit 4 of this embodiment is capable of adjusting the sensitivity for detecting the signal component according to the ratio of the K value, which is the transconductance coefficient constituting the current mirror circuit, and, similar to the third embodiment, detecting the current change due to a very small signal component for the DC component in the input current Iin flowing through the input port 101.

In addition, for each of the above configurations, the current detection circuit of the present invention is capable of detecting the current of the signal component of any device, as long as the current is from a device that generates a current containing a signal component. For example, even if the current is from a device that generates photocurrent with a photodiode or a device that generates current by receiving radio waves, the current detection device of the present invention is capable of detecting those currents of the signal component from the signal input.

What is claimed is:

1. A current detection circuit, comprising:
   an input port;
   an output port;
   a rectifying element;
   a capacitor;
   a first first conductivity type MOS transistor; and
   a voltage detection circuit,
   wherein the input port is connected to an anode terminal of the rectifying element, a drain terminal of the first first conductivity type MOS transistor, and a voltage detection terminal of the voltage detection circuit,
   a cathode terminal of the rectifying element is connected to a first terminal of the capacitor and a gate terminal of the first first conductivity type MOS transistor,
   a second terminal of the capacitor and a source terminal of the first first conductivity type MOS transistor are connected to a first power source terminal, and
   a detection result output port of the voltage detection circuit is connected to the output port.

2. The current detection circuit according to claim 1, further comprising a second first conductivity type MOS transistor,
   wherein a drain terminal and a gate terminal of the second first conductivity type MOS transistor are connected to the gate terminal of the first first conductivity type MOS transistor, and
   a source terminal of the second first conductivity type MOS transistor is connected to the first power source terminal.

3. The current detection circuit according to claim 1, wherein the voltage detection circuit comprises:
   the voltage detection terminal;
   the detection result output port;
   a third first conductivity type MOS transistor; and
   a load element,
   the voltage detection terminal is connected to a gate terminal of the third first conductivity type MOS transistor, a drain terminal of the third first conductivity type MOS transistor is connected to a first terminal of the load element and the detection result output port,
   a source terminal of the third first conductivity type MOS transistor is connected to the first power source terminal, and
   a second terminal of the load element is connected to a second power source terminal.

* * * * *